United States Patent [19]

Plihal

[11] Patent Number: 4,835,575
[45] Date of Patent: May 30, 1989

[54] MONOLITHICALLY INTEGRATED WAVEGUIDE-PHOTODIODE COMBINATION

[75] Inventor: Manfred Plihal, Munich, Fed. Rep. of Germany

[73] Assignee: Siemens Aktiengesellschaft, Berlin and Munich, Fed. Rep. of Germany

[21] Appl. No.: 151,854

[22] Filed: Feb. 3, 1988

[30] Foreign Application Priority Data

Feb. 6, 1987 [DE] Fed. Rep. of Germany ....... 3703657

[51] Int. Cl.$^4$ ........................................... H01L 27/14
[52] U.S. Cl. ...................................... 357/30; 357/19; 357/16; 357/20; 333/248
[58] Field of Search ........................... 357/19, 16, 20; 333/248, 246, 239, 247

[56] References Cited

U.S. PATENT DOCUMENTS

| | | | |
|---|---|---|---|
| 3,969,014 | 6/1976 | Auracher | 350/96 C |
| 4,740,819 | 4/1988 | Ouchi et al. | 357/30 E XR |

FOREIGN PATENT DOCUMENTS

| | | | |
|---|---|---|---|
| 0187979 | 12/1985 | | |
| 2363253 | 6/1975 | Fed. Rep. of Germany | |
| 3046140A1 | 7/1982 | Fed. Rep. of Germany | |
| 3600458A1 | 7/1986 | Fed. Rep. of Germany | |
| 54-33684 | 3/1979 | Japan | 357/16 |
| 57-71191 | 5/1982 | Japan | 357/30 E |
| 57-198668 | 12/1982 | Japan | 357/30 E |
| 60-79781 | 5/1985 | Japan | 357/30 E |
| 61-79268 | 4/1986 | Japan | 357/30 E |

OTHER PUBLICATIONS

Ostrowsky et al., "Integrated Optical Photodetector," Appl. Phys. Lett., vol. 22, No. 9, May 1, 1973, pp. 463–464.
Stillman et al., "Monolithic Integrated inGaAs Schottky-Barrier Waveguide Photodetector," Applied Physics Letters, vol. 25, No. 1, Jul. 1, 1974, pp. 36–38.
Publication by G. E. Stillman, entitled "Monolithic Integrated In$_x$GA$_{1-x}$As Schottky-Barrier Waveguide Photodetector", Applied Physics Letters, vol. 25, No. 1, Jul. 1974, pp. 36–38.
Publication by D. B. Ostrowsky et al. entitled "Integrated Optical Photodetector", Appl. Phys. Lett., vol. 22, No. 9., May 1973, pp. 463, 464.

Primary Examiner—William L. Sikes
Assistant Examiner—William A. Mintel
Attorney, Agent, or Firm—Hill, Van Santen, Steadman & Simpson

[57] ABSTRACT

A monolithically integrated waveguide-photodiode combination for optical communications systems includes a carrier substrate of n-conductive semiconductor material, a further layer of the same material in whose surface is formed a strip-shaped n-conductive absorption layer, and of a waveguide formed thereon. A p-doping is diffused into the waveguide through the n-conductive absorption layer and a photodiode is thereby formed. A contact for the positive electrode of the photodiode is applied over the p-conductive region and the contact for the negative electrode is applied to the free side of the carrier substrate. The waveguide is covered by a cover layer along its top surface.

8 Claims, 2 Drawing Sheets

MONOLITHICALLY INTEGRATED WAVEGUIDE-PHOTODIODE COMBINATION

BACKGROUND OF THE INVENTION

1. Field of the Invention

The present invention is related generally to a monolithically integrated waveguide-photodiode combination for integration into optical communications systems.

2. Description of the Related Art

In a publication by Stillman et al., "Monolithic Integrated $In_xGa_{1-x}As$ Schottky-Barrier Waveguide Photodetector", Applied Physics Letters 25, 36–38 (1974) and in a publication by Ostrowsky et al., "Integrated Optical Photodetector", Applied Physics Letters 22, 463–464 (1973), waveguide photodiode combinations are disclosed wherein incident radiation is conducted directly onto the photodiode by butt-coupling between the waveguide and the photodiode.

A European published application number 0 187 979 discloses a waveguide-photodiode combination wherein one component of the photodiode is composed of a material that has a higher refractive index than the material of the waveguide. Consequently, incident radiation is coupled into the photodiode. A waveguide layer composed of a quaternary material, for example InGaAsP, is applied to a substrate body of InP that either has an adequately smooth structured surface or an additional InP layer epitaxially applied. A photodiode is composed of a ternary material of, for example, InGaAs, and is formed on the layer waveguide. The photodiode is composed either of two layers epitaxially applied in succession where one layer is n-doped like the rest of the component and the other layer situated thereabove exhibits a p-doping, or the photodiode is composed of a single layer that is originally n-doped and into which a p-doping has been introduced from above, for example, by diffusion. The arrangement can be covered by a layer of $Si_3N_4$, polyimide, or InP.

In the disclosed waveguide-photodiode combination, the photodiode is situated at the surface of the component in a mesa structure. This structure is characterized by a relatively high dark current for the photodiode, which results in poor documentation sensitivity when integrated in optical receivers. Moreover, the long-term stability of planar photodiodes is significantly higher than that of photodiodes having a mesa structure.

SUMMARY OF THE INVENTION

An object of the present invention is to provide a waveguide-photodiode combination having a higher sensitivity and greater long-term stability which can be economically manufactured in high piece numbers. This and other objects of the invention are achieved in a monolithically integrated waveguide-photodiode combination where the carrier substrate is of a first semiconductor material and the waveguide is of a second semiconductor material, the refractive index of the first semiconductor material being lower than the refractive index of the second semiconductor material. A photodiode formed of an n-conductive absorption layer is situated in a strip in the carrier substrate at the boundary surface between the carrier substrate and the waveguide, the n-conductive absorption layer having a higher refractive index than the material of the waveguide. A p-conductive doping of the photodiode lies in the waveguide, the p-conductive doping extending at least up to the boundary surface to the n-conductive absorption layer. The resulting waveguide-photodiode combination is planar.

The present invention achieves the stated object in that the photodiode is integrated into the waveguide such that radiation from the waveguide is coupled into the photodiode by leakage wave coupling. The photodiode is thereby integrated into the waveguide itself as well as into the substrate carrier situated therebelow.

The structure of the waveguide-photodiode combination is composed of a carrier substrate that is composed of a semiconductor material which is preferably provided with an epitaxially grown layer of the same semiconductor material to provide an improved surface. A waveguide is applied thereto and is composed of a semiconductor material having a higher refractive index than the material of the substrate. First however, a semiconductor material that has a higher refractive index compared to the waveguide and which is n-conductively doped is grown in a trench etched into the substrate carrier. The resulting trench-shaped layer forms the absorption layer for the photodiode. The photodiode is formed when a p-doping is introduced into the waveguide, for example, by diffusion or implantation, through openings in a cover layer of $Si_3N_4$. The region of p-conductive doping must at least extend up to the absorption layer disposed in the etched trench. The transition between the region of p-conductive doping and the n-conductive region of the absorption layer lies on the boundary between the waveguide and the absorption layer or in the absorption layer itself.

A further layer of the semiconductive material of the carrier substrate may be applied between the waveguide and the cover layer. Contacts for positive electrodes are applied over the photodiodes. When the carrier substrate is n-conductively doped, the contacts of a negative electrode are situated on the underside of the carrier substrate. When the carrier substrate is semi-insulating, the contact for the negative electrode is applied in a recess of the cover layer outside of the region occupied by the photodiodes.

Exemplary embodiments of the invention have an InP substrate carrier for transmission in the wavelength range between 1.3 $\mu$m and 1.5 $\mu$m.

Included in the present invention is the possibility of providing a plurality of the waveguide-photodiode combinations in an array.

DESCRIPTION OF THE PREFERRED EMBODIMENTS

Figure 1:
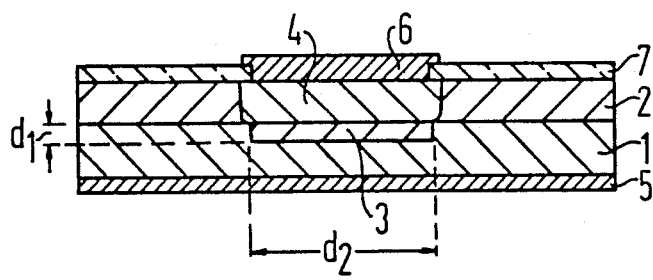
FIG. 1 is a cross section of a waveguide-photodiode combination according to the principles of the present invention.

In FIG. 1 is shown a basic format of a waveguide-photodiode combination, wherein a carrier substrate 1 is composed of n-conductively doped InP having a typical doping concentration of $5 \times 10^{18}$ cm$^{-3}$ and (100)-orientation. The dimensions of the carrier substrate are such that the substrate provides adequate mechanical stability to the finished component.

Figure 6:
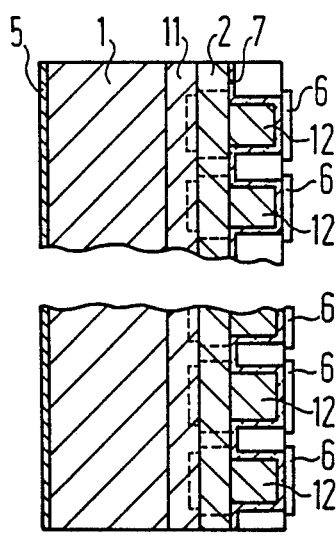
FIG. 6 is a cross section of the array of FIG. 5 taken along line VI—VI.

A strip-shaped trench 3 having a depth $d_1$ of about 1 to 2 $\mu$m, a length $d_2$ of about 200 to 300 $\mu$m and a width $d_3$ (into the pages relative to FIG. 1 and as shown in FIG. 6) of about 20 to 500 $\mu$m is etched into the carrier substrate 1 at the top surface thereof. The strip-shaped trench 3 is epitaxially filled with a layer of In$_{0.53}$Ga$_{0.47}$As that is n-conductively doped with a typical concentration of $5 \times 10^{15}$ cm$^{-3}$. This provides a layer, also referenced 3, having a surface which is co-planar with that of the carrier substrate 1. The strip-shaped semiconductor layer 3 forms the n-conductive absorption layer of a photodiode.

As a next layer, a waveguide 2 of InGaAsP is applied on the top surface of the substrate 1. The thickness and composition of the waveguide layer 2 is selected so that a monomode layer waveguide is formed for light having a wavelength of between 1.3 micrometers and 1.5 micrometers. At the top thereof, the waveguide 2 is provided with a cover layer 7 of Si$_3$N$_4$ which serves as a passivation layer and as a diffusion mask. Quadrilateral regions having a length $d_2$ of about 200 to 300 $\mu$m and a width $d_3$ of approximately 20 $\mu$m to 500 $\mu$m are recessed into the cover layer 7 over the n-conductive absorption layer 3. Regions having p-conductive doping 4 are formed by diffusion into the waveguide 2 below the quadrilateral regions. The pn-junction lies at the boundary surface between the waveguide 2 and the n-conductive absorption layer 3, or else can lie slightly deeper in the n-conductive absorption layer 3. Except for the regions of the p-conductive doping 3 and the cover layer 7, the waveguide-photodiode combination is n-conductivity doped.

Contacts for a positive electrode 6 for the photodiode are applied in the quadrilateral recesses in the cover layer 7 above the p-doped regions 4. Contacts for a negative electrode 5 are applied to a free or lower side of the carrier substrate 1.

Figure 2:
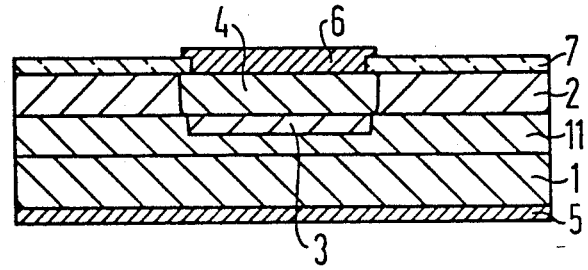
FIG. 2 is a cross section of a further embodiment of a waveguide-photodiode combination of the invention.

Referring to the embodiment of FIG. 2, in which corresponding reference numerals refer to identical parts, a further layer 11 of n-conductive InP which is approximately 3 $\mu$m thick and has a typical doping concentration of $5 \times 10^{18}$ cm$^{-3}$ is applied on the surface of the carrier substrate 1. This improves the layer quality. The layer 11 is preferrably epitaxially applied and is of the same semiconductor material as the substrate carrier 1. The further layer 11, thus, lies at the boundary surface with the waveguide 2. The n-conductive absorption layer 3 is formed in a strip-shaped trench in the further layer 11 so that the layer 3 is integrated into the further layer 11.

Figure 4:
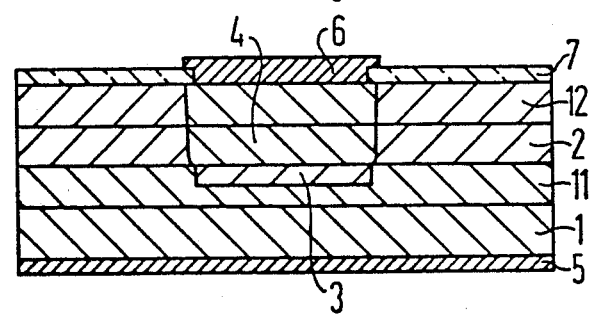
FIG. 4 is a cross section of yet another embodiment of a waveguide-photo combination of the invention.

With reference now to FIG. 4, an arrangement is shown wherein the waveguide 2 has both sides limited by n-conductively doped InP layers. An addition layer 12 of n-conductive InP is applied between the waveguide 2 and the cover layer 7. The p-conductive doping for the formation of the photodiode is introduced into the waveguide 2 through the additional layer 12, for example, by diffusion. Thus, the additional layer 12 lies at the side of the waveguide 2 opposite the carrier substrate 1.

Figure 3:
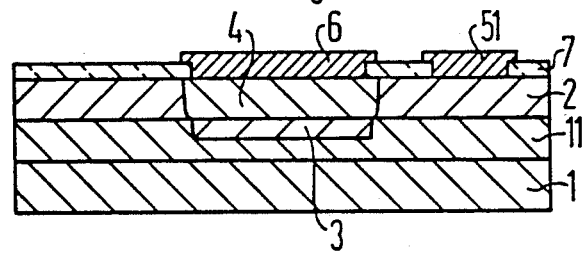
FIG. 3 is a cross section of another embodiment of a waveguide-photodiode combination.

Instead of being composed of n-conductively doped semiconductor material, the semiconductor substrate 1 may be composed of a semi-insulating InP material. In FIG. 3, the resulting structure is shown. In this case, a contact for a negative electrode 51 is applied in a recess through the cover layer 7 on the waveguide 2 outside of the region occupied by the photodiode.

Figure 5:
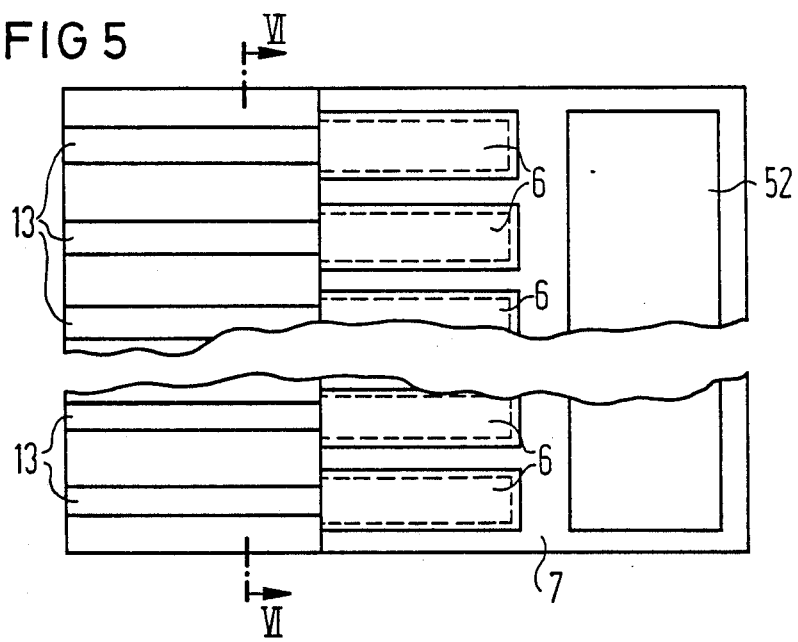
FIG. 5 is a plan view of a plurality of the waveguide-photodiode combinations forming an array.

A plurality of the waveguide-photodiode combinations of the invention may be provided in an array. In FIG. 5 is shown a plan view of a waveguide-photodiode array according to the invention. The waveguide is formed as a plurality of strip waveguides 13. The strip waveguides 13 are generated by either etching the waveguide layer 2 to form the appropriate strips, or by etching into the further layer 12, when provided, at the intermediate regions between the strips. Such etching of the further layer 12 is carried out down to the waveguide layer 2. The positive electrodes 6 for each of the individual photodiodes are applied on the p-conductively doped regions marked by broken lines.

When a semi-insulating carrier substrate 1 is used, a negative electrode 52 is applied to an upper side of the component. Otherwise, the negative electrode is applied on the lowerside thereof. That portion of the top surface which is not covered by metal contacts is covered by the cover layer 7.

In alternate embodiments, the individual strip waveguides 13 can be brought together at Y-shaped branchings as fan-outs to form one or more principle waveguides (not shown). In addition, the strip waveguides 13 may be provided with known wavelength selective gratings, or grating structures can be integrated into the waveguides 13. This provides the possibility of only light of a defined wavelength reaching the respective photodiodes.

In FIG. 6, the component of FIG. 5 is shown in cross section from the left. The photodiode structures can be seen extending into the layer 11. The strip waveguides 13 are defined in the layer 2 by the etched strips in the overlying layer 12. The electrodes 6 are applied over the photodiodes. In the embodiment of FIG. 6, the negative electrode 5 is applied to the bottom surface of the component.

Although other modifications and changes may be suggested by those skilled in the art, it is the intention of the inventor to embody within the patent warranted hereon all changes and modifcations as reasonably and properly come within the scope of his contribution to the art.

I claim:

1. A monolithically integrated waveguide-photodiode combination, comprising:
    a carrier substrate of a first semiconductor material;
    a waveguide disposed on said carrier substrate for guiding electromagnetic waves and being of a second semiconductor material, said second semiconductor material having a refractive index higher than a refractive index of said first semiconductor material;
    at least one photodiode coupled to said waveguide and having a region of p-conductive doping and an n-conductive absorption layer, said n-conductive absorption layer being disposed in a strip in said carrier substrate at a boundary surface between said carrier substrate and said waveguide, said n-conductive absorption layer of said at least one photodiode having a higher refractive index than said second semiconductor material of said waveguide, said p-conductive doping of said photodiode lying in said waveguide, said p-conductive doping extending at least up to a boundary surface of said n-conductive absorption layer; and said waveguide-photodiode combination having a surface which is planar.

2. A monolithically integrated waveguide-photodiode combination as claimed in claim 1, further comprising:

a layer of $Si_3N_4$ applied to said waveguide as a passivation layer and as a mask for diffusion and for contacts for a positive electrode.

3. A monolithically integrated waveguide-photodiode combination as claimed in claim 1, further comprising:

an epitaxially applied further layer provided between said carrier substrate and said waveguide, said further layer being of said first semiconductor material; and said n-conductive absorption layer of said at least one photodiode being integrated into said further layer.

4. A monolithically integrated waveguide-photodiode combination as claimed in claim 1, wherein said first semiconductor material of said carrier substrate is of InP.

5. A monolithically integrated waveguide-photodiode combination as claimed in claim 1, wherein said carrier substrate is of a semi-insulating semiconductor material.

6. A monolithically integrated waveguide-photodiode combination as claimed in claim 1, wherein said waveguide is composed of InGaAsP, and the n-conductive strip-shaped absorption layer of said photodiode is composed of InGaAs.

7. A monolithically integrated waveguide-photodiode combination as claimed in claim 1, further comprising:

an additional layer of said first semiconductor material applied to said waveguide at a side opposite said carrier substrate so that said first semiconductor material surrounds said waveguide at two sides.

8. A monolithically integrated waveguide-photodiode combination as claimed in claim 1, wherein said waveguide is a strip waveguide, and wherein said at least one photodiode is a plurality of diodes connected to a plurality of said strip waveguides.

* * * * *